(12) United States Patent
Fang et al.

(10) Patent No.: US 8,096,681 B2
(45) Date of Patent: Jan. 17, 2012

(54) LED LAMP

(75) Inventors: Hai-Ming Fang, Shenzhen (CN);
Yong-Dong Chen, Shenzhen (CN);
Shih-Hsun Wung, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 340 days.

(21) Appl. No.: 12/468,053

(22) Filed: May 19, 2009

(65) Prior Publication Data

US 2010/0157597 A1    Jun. 24, 2010

(30) Foreign Application Priority Data

Dec. 24, 2008   (CN) .......................... 2008 1 0306510

(51) Int. Cl.
*F21V 7/00*   (2006.01)
(52) U.S. Cl. .................. 362/249.02; 362/227; 362/245; 362/341; 362/247
(58) Field of Classification Search ............. 362/249.02, 362/223, 217.05, 227, 235, 237, 245, 247, 362/297, 300, 328, 341, 346
See application file for complete search history.

(56) References Cited

U.S. PATENT DOCUMENTS

| | | | | | |
|---|---|---|---|---|---|
| 4,336,576 | A | * | 6/1982 | Crabtree | 362/240 |
| 5,103,331 | A | * | 4/1992 | Taniguchi et al. | 349/155 |
| 5,988,829 | A | * | 11/1999 | Holder | 362/223 |
| 7,438,436 | B2 | * | 10/2008 | Moon | 362/247 |
| 7,441,916 | B2 | * | 10/2008 | Masuyama et al. | 362/97.1 |
| 7,815,330 | B2 | * | 10/2010 | Kim et al. | 362/97.3 |
| 7,883,239 | B2 | * | 2/2011 | Rains et al. | 362/231 |

FOREIGN PATENT DOCUMENTS

CN    101270855    9/2008

* cited by examiner

*Primary Examiner* — Anabel Ton
(74) *Attorney, Agent, or Firm* — Altis Law Group, Inc.

(57) ABSTRACT

An LED lamp includes a lamp frame, a reflector received in the lamp frame, a plurality of LED modules received in the lamp frame and an envelope covering an opening of the lamp frame. The lamp frame is made of a material with a good heat conductivity and thermally connects the LED modules. The reflector includes a plurality of interconnecting reflecting cells, each reflecting cell separating a corresponding LED module from others. Each LED module faces to a corresponding reflecting cell and light emitted therefrom is reflected by the reflecting cell to radiate out of the envelope.

16 Claims, 5 Drawing Sheets

LED LAMP

BACKGROUND

1. Technical Field

The present disclosure relates to an LED (light emitting diode) lamp and, more particularly, to an improved LED lamp having an even illumination and a large illumination area.

2. Description of Related Art

An LED lamp as a new type of light source can generate brighter light, and have many advantages, e.g., energy saving, environment friendly and longer life-span, compared to conventional light sources. Therefore, the LED lamp has a trend of substituting for conventional lamps.

A conventional LED lamp comprises a plate-shaped heat sink and an LED module attached to a bottom of the heat sink. In use of the LED lamp, light generated by the LED module directly irradiates to an outside of the LED lamp. Since LEDs of the LED module are conventionally arranged on a PCB of the LED module in a discrete matrix manner, the light emitted by the LEDs cannot radiate to an ambient environment uniformly and illumination area of the LED lamp is not large, which cause some troublesome problems, e.g., light beams with different light intensities, light glare. In addition, due to being mounted on the bottom of the heat sink, the light produced by the LED module can only project from the bottom of the heat sink and cannot illuminate other places around the LED lamp, whereby an application of the LED lamp is prohibited in some fields which need a large light illumination area, such as navigation light.

What is needed, therefore, is an LED lamp which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
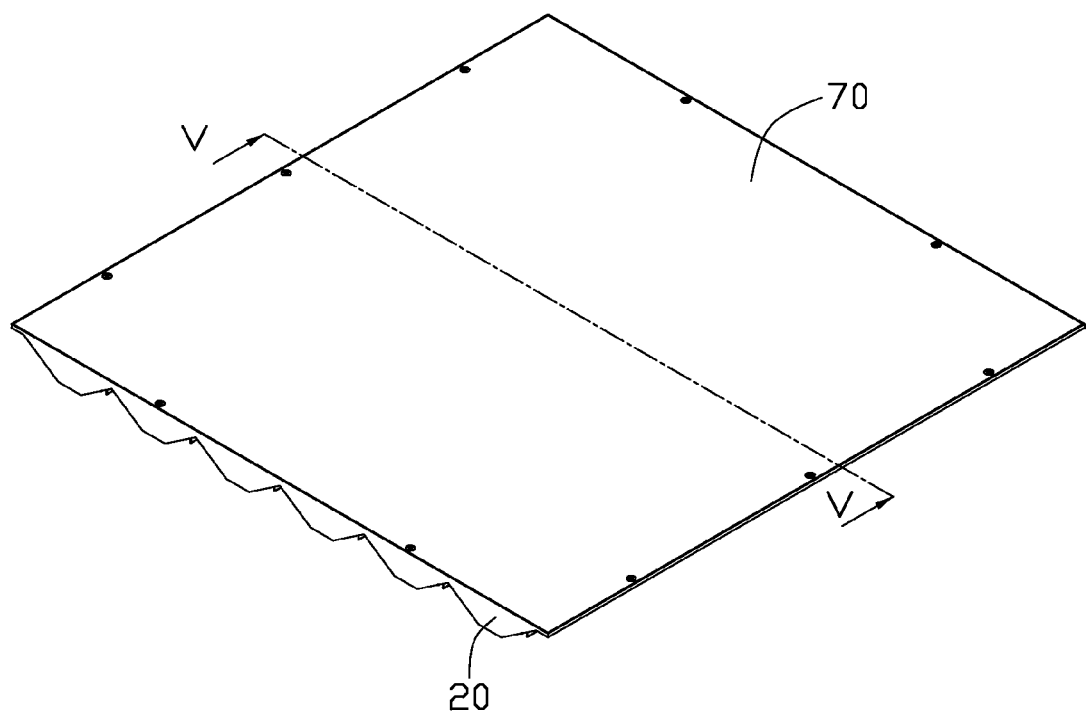
FIG. 1 is an isometric, assembled view of an LED lamp in accordance with an embodiment of the disclosure.
Figure 2:
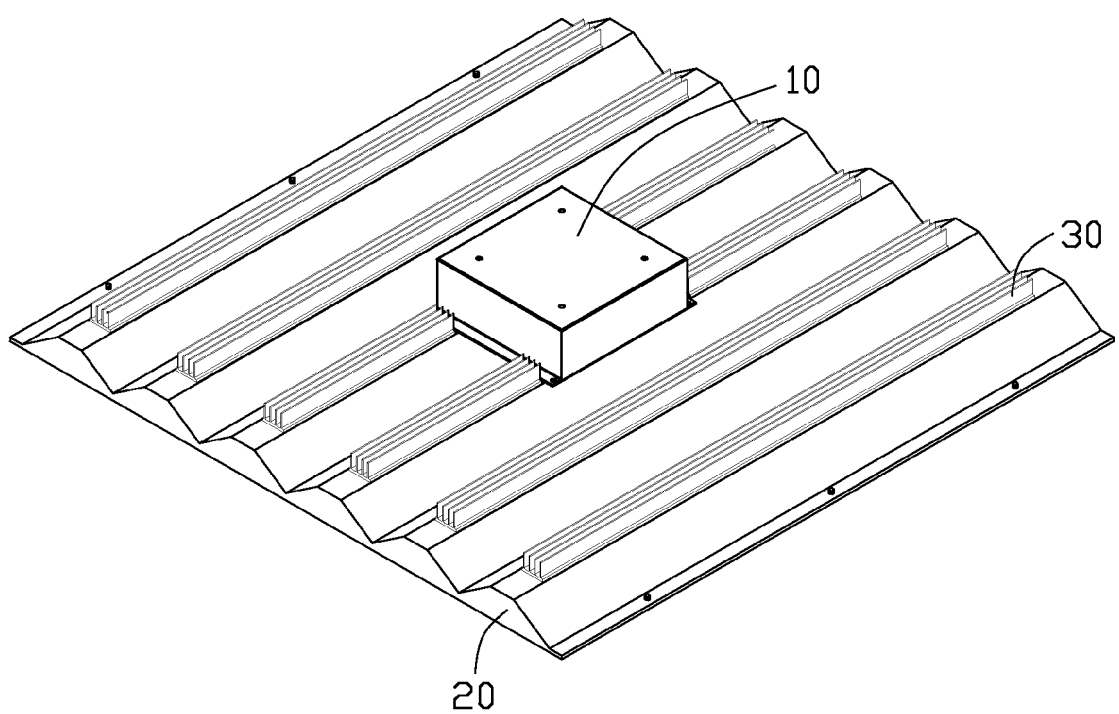
FIG. 2 is an inverted view of the LED lamp of FIG. 1.

Referring to FIGS. 1-4, an LED lamp in accordance with an embodiment of the disclosure includes a casing 10, a lamp frame 20 mounted on the casing 10, a plurality of heat sinks 30 attached to a bottom of the lamp frame 20 and surrounding the casing 10, a reflector 40 and a plurality of LED modules 50 received in the lamp frame 20. A plurality of fixing brackets 60 fix the LED modules 50 in the lamp frame 20. An envelope 70 covers the lamp frame 20.

Figure 5:
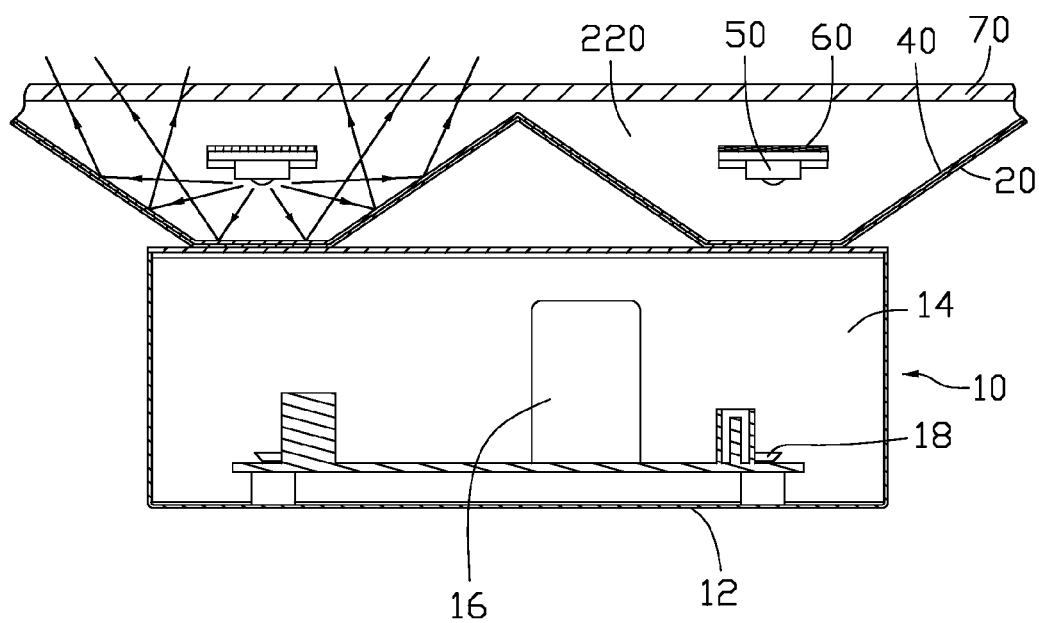
FIG. 5 is a cross-sectional view of FIG. 1, taken along a line V-V thereof.

Also referring to FIG. 5, the casing 10 is cubic and includes six interconnecting rectangular plates 12 cooperatively defining a chamber 14. A driving module 16 is received in the chamber 14 and fastened on the plate 12 at a bottom of the casing 10 via screws 18. The plate 12 at a top of the casing 10 is fastened on a center of the bottom of the lamp frame 20 and defines a plurality of through holes 120. The driving module 16 has lead wires (not shown) extending through the through holes 120 and electrically connecting the LED modules 50 to provide power supply and controlling signals for the LED modules 50.

Figure 3:
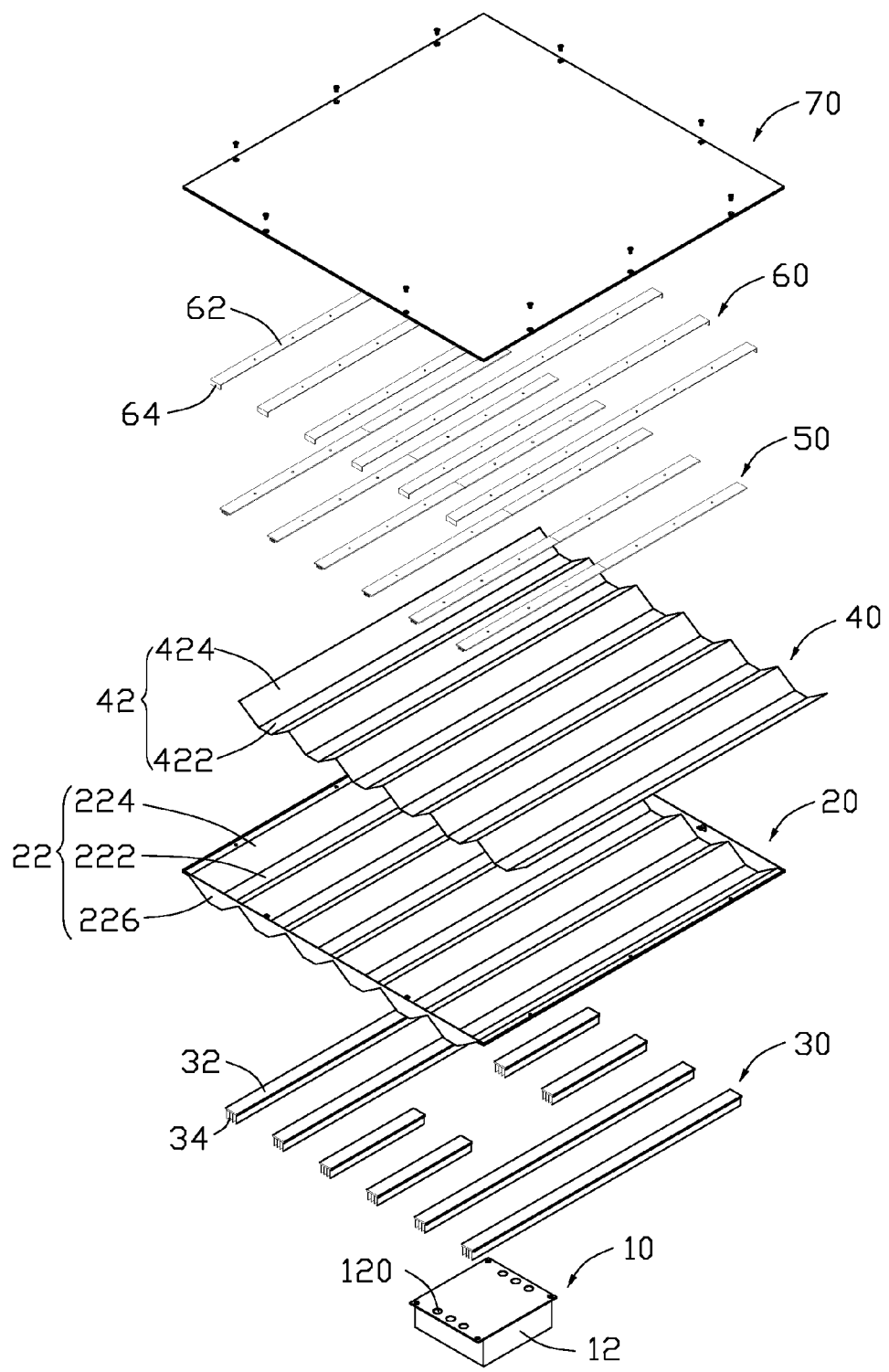
FIG. 3 is an exploded view of the LED lamp of FIG. 1.
Figure 4:
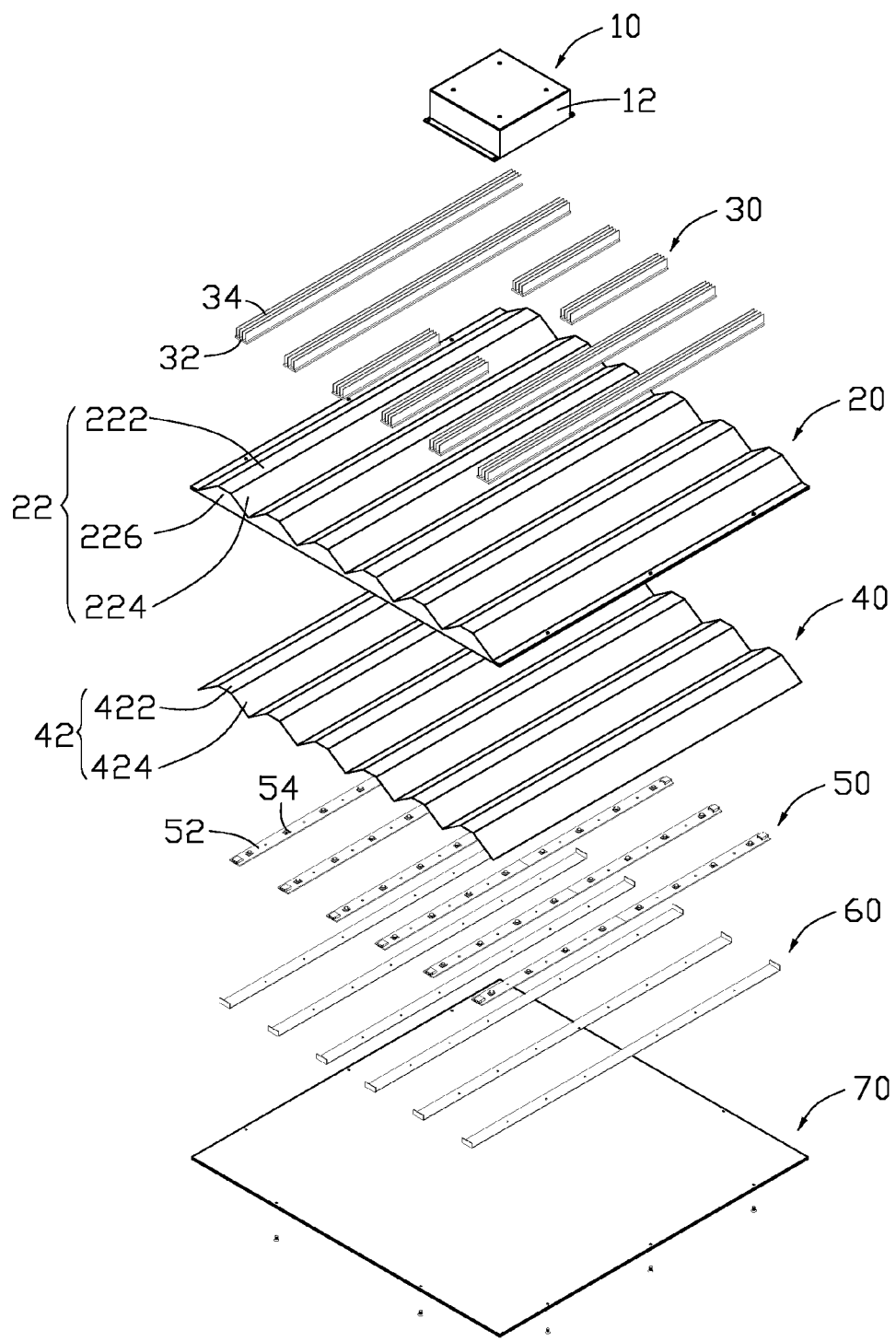
FIG. 4 is an inverted view of the LED lamp of FIG. 3.

Particularly referring to FIG. 3, the lamp frame 20 is made of metal such as aluminum, copper or an alloy thereof. The lamp frame 20 includes a plurality of interconnecting frame units 22 each having a trapezoid cross section. Each of the frame units 22 includes a rectangular base plate 222, two folding plates 224 slantwise and upwardly extending from two longer edges of the base plate 222 and two baffle plates 226 vertically extending from two shorter edges of the base plate 222, whereby a receiving room 220 is defined at an inner side of the frame unit 22 for receiving a corresponding LED module 50 therein. Two adjacent frame units 22 interconnect together via the folding plates 224 thereof.

The heat sinks 30 each include an elongated heat conducting plate 32 and a plurality of fins 34 vertically extending from a bottom face of the heat conducting plate 32. Each heat conducting plate 32 is attached to the base plate 222 of a corresponding frame unit 22. The heat sinks 30 together define a central space corresponding to a central portion of the lamp frame 20 for positioning the casing 10. The heat sinks 30 absorb heat generated by the LED modules 50 and dissipate the heat into ambient air when the LED lamp is operated.

The reflector 40 is integrally bent from a flat sheet and has a shape corresponding to that of the lamp frame 20 such that the reflector 40 can be intimately adhered on an inner face of the lamp frame 20. The reflector 40 includes a plurality of interconnecting reflecting cells 42 each having a trapezoid cross section. Each of the LED modules 50 is received in a corresponding reflecting cell 42. Each of the reflecting cells 42 includes a rectangular base portion 422 and two folding portions 424 slantwise and upwardly extending from two longer edges of the base portion 422, whereby the two folding portions 424 of each reflecting cell 42 separate a corresponding LED module 50 from others. Two adjacent reflecting cells 42 interconnect together via the folding portions 424 thereof. The reflector 40 has an inner face coated with a film of reflecting material, by which light emitted from the LED modules 50 can be reflected out of the LED lamp.

The LED modules 50 each include a rectangular printed circuit board 52 and a plurality of LEDs 54 attached on the printed circuit board 52.

The fixing brackets 60 each are bent from a metal sheet and include a rectangular body 62 and two fixing portions 64 vertically extending from two opposite ends of the body 62. Each of the LED modules 50 is attached to a bottom face of the body 62 of a corresponding fixing bracket 60 to make the LEDs 54 face to a corresponding base portion 422 of the reflector 40 and opposite to the envelope 70. The fixing portions 64 of each fixing bracket 60 are fastened on the inner faces of the baffle plates 226 of a corresponding frame unit 22. Heat generated from the LED modules 50 can be transferred to the fixing brackets 60, the lamp frame 20 and the heat sinks 30 in sequence.

The envelope 70 is made of transparent or semitransparent material, such as glass etc., to allow light to penetrate therethrough. When the envelope 70 is made of a semitransparent material, the LED lamp in accordance with the disclosure can generate more soft and uniform light. The envelope 70 is a rectangular plate and covers on an opening of the lamp frame 20 to envelop the LED modules 50 and the fixing brackets 60 in the lamp frame 20.

In assembly, the heat sinks 30 are fastened on the base plates 222 of the lamp frame 20. The casing 10 is positioned among the heat sinks 30 and attached to the base plates 222 of the lamp frame 20. The reflector 40 is adhered on the inner face of the lamp frame 20. The LED modules 50 are attached to the bottom faces of the fixing brackets 60. The fixing portions 64 of the fixing brackets 60 are fastened on the inner faces of the baffle plates 226 of the lamp frame 20. The envelope 70 is covered on an opening of the lamp frame 20.

In operation, the LED modules 50 get power from the driving module 16 and generate light. Shown as arrows in the FIG. 5, a part of the light directly projects to the base portions 422 of the reflector 40, another part of the light directly projects to the folding portions 424 of the reflector 40. When reaching the inner face of the base portions 422 and the folding portions 424 of the reflector 40, the light is reflected out of the LED lamp. The light emitted from the LED modules 50 is reflected in a multidirectional manner, which increases the illumination area of the LED lamp.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED lamp, comprising:
a lamp frame made of a material with a good heat conductivity;
a reflector received in the lamp frame and comprising a plurality of interconnecting reflecting cells;
a plurality of LED modules received in and thermally connecting the lamp frame, each LED module being separated from others by a corresponding reflecting cell of the reflector, light emitted from each LED module radiating toward the corresponding reflecting cell; and
an envelope covering an opening of the lamp frame, in which the LED modules face oppositely to the envelope, and light generated by the LED modules are first reflected by the reflector and then radiate through the envelope;
wherein each of the reflecting cells comprises a base portion and two folding portions slantwise extending from two sides of the base portion, two adjacent reflecting cells interconnecting together via the folding portions thereof, each LED module facing to a corresponding base portion.

2. The LED lamp as claimed in claim 1, wherein the reflector is integrally bent from a flat sheet, each of the reflecting cells having a trapezoid cross section.

3. The LED lamp as claimed in claim 1, wherein the lamp frame has a shape corresponding to that of the reflector, the reflector being adhered on an inner face of the lamp frame.

4. The LED lamp as claimed in claim 1, wherein the lamp frame comprises a plurality of interconnecting frame units, each reflecting cell being received in a corresponding frame unit.

5. The LED lamp as claimed in claim 4, wherein each frame unit comprises a base plate and two folding plates slantwise extending from two longer edges of the base plate and two baffle plates vertically extending from two shorter edges of the base plate, two adjacent frame units interconnecting together via the folding plates thereof, the LED modules being fastened on the baffle plates of the lamp frame, each LED module facing to a corresponding base plate.

6. The LED lamp as claimed in claim 5 further comprising a plurality of fixing brackets each made of a material with a good heat conductivity, wherein each of the fixing brackets comprises a body and two fixing portions extending from two opposite ends of the body, each of the LED modules being attached to the body of a corresponding fixing bracket, the fixing portions of each fixing bracket being fixed on the baffle plates of a corresponding frame unit.

7. The LED lamp as claimed in claim 5 further comprising a casing comprising six interconnecting rectangular plates, one of the plates of the casing connecting the base plates of the lamp frame.

8. The LED lamp as claimed in claim 7 further comprising a driving module received in the casing and electrically connecting the LED modules.

9. The LED lamp as claimed in claim 5 further comprising a plurality of heat sinks, each of the heat sinks comprising a heat conducting plate attached to the base plate of a corresponding frame unit and a plurality of fins extending from the heat conducting plate.

10. The LED lamp as claimed in claim 1, wherein the envelope is made of one of transparent and semitransparent materials.

11. An LED lamp, comprising:
a lamp frame made of a material with a good heat conductivity and comprising a plurality of interconnecting frame units, bottoms of the frame units cooperatively defining an opening of the lamp frame;
a reflector comprising a plurality of interconnecting reflecting cells respectively received in the frame units;
an envelope mounted to the lamp frame at the opening to cover the opening; and
a plurality of LED modules respectively received in and thermally connecting the frame units, each LED module facing to a corresponding frame unit, light emitted from the LED modules being reflected out of the envelope by the reflector;
wherein each frame unit comprises a base plate and two folding plates slantwise extending from two longer edges of the base plate and two baffle plates vertically extending from two shorter edges of the base plate, two adjacent frame units interconnecting together via the folding plates thereof, the LED modules being fastened on the baffle plates of the lamp frame, each LED module facing to a corresponding base plate.

12. The LED lamp as claimed in claim 11 further comprising a plurality of fixing brackets each made of a material with a good heat conductivity, each of the fixing brackets comprising a body and two fixing portions extending from two opposite ends of the body, each of the LED modules being attached to the body of a corresponding fixing bracket, the fixing portions of each fixing bracket being fixed on the baffle plates of a corresponding frame unit.

13. The LED lamp as claimed in claim 11 further comprising a casing comprising six interconnecting rectangular plates, one of the plates of the casing connecting the base plates of the lamp frame.

14. The LED lamp as claimed in claim 13 further comprising a driving module received in the casing and electrically connecting the LED modules.

15. The LED lamp as claimed in claim 11, further comprising a plurality of heat sinks, each of the heat sinks comprising a heat conducting plate attached to the base plate of a corresponding frame unit and a plurality of fins extending from the heat conducting plate.

16. An LED lamp, comprising:
a lamp frame made of a material with a good heat conductivity;
a reflector received in the lamp frame and comprising a plurality of interconnecting reflecting cells;

a plurality of LED modules received in and thermally connecting the lamp frame, each LED module being separated from others by a corresponding reflecting cell of the reflector, light emitted from each LED module radiating toward the corresponding reflecting cell; and an envelope covering an opening of the lamp frame, in which the LED modules face oppositely to the envelope, and light generated by the LED modules are first reflected by the reflector and then radiate through the envelope;

wherein the lamp frame comprises a plurality of interconnecting frame units, each reflecting cell being received in a corresponding frame unit; and wherein each frame unit comprises a base plate and two folding plates slantwise extending from two longer edges of the base plate and two baffle plates vertically extending from two shorter edges of the base plate, two adjacent frame units interconnecting together via the folding plates thereof, the LED modules being fastened on the baffle plates of the lamp frame, each LED module facing to a corresponding base plate.

\* \* \* \* \*